Nov. 4, 1958 G. F. ZIFFER 2,859,287
LINEAR AMPLIFIER
Filed April 5, 1954
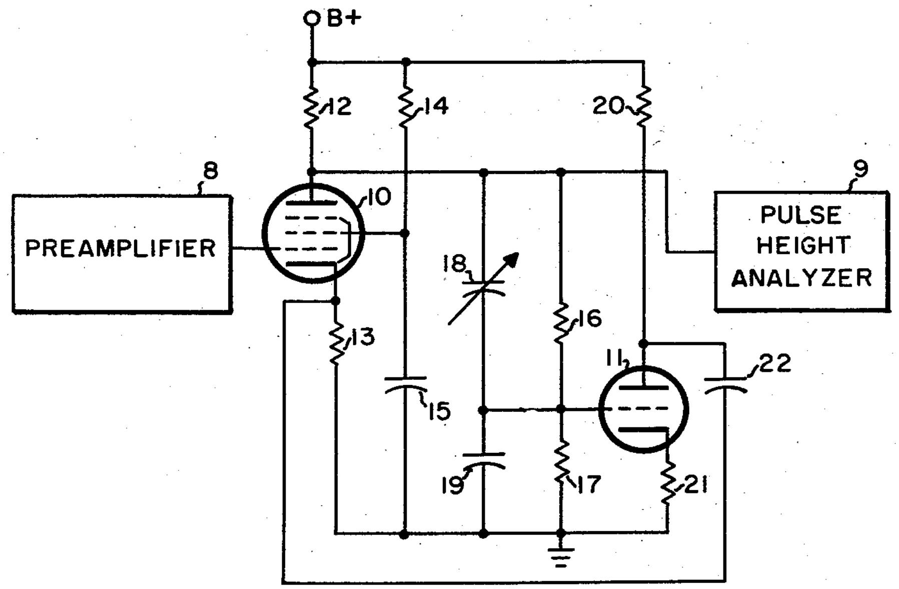
INVENTOR
GARRET F. ZIFFER
BY
Spencer E. Olson
ATTORNEY 2,859,287
Patented Nov. 4, 1958

2,859,287

LINEAR AMPLIFIER

Garret F. Ziffer, Wayland, Mass., assignor to Tracerlab, Inc., Boston, Mass., a corporation of Massachusetts Application April 5, 1954, Serial No. 420,953

1 Claim. (Cl. 179—171)

This invention relates to linear amplifiers and is more particularly concerned with an improved linear pulse amplifier having a wide dynamic range.

Linear amplifiers are widely used in nuclear research and other pulse counting applications where it is necessary to study signals having a wide range of amplitudes, and have particular value in scintillation or proportional counted spectrometry. In these applications, the amplifier must have the same gain over a wide range of amplitude of input signals, and small pulses must be faithfully reproduced even when they closely follow a pulse large enough to drive the amplifier out of its linear range.

Considerable work has been done to develop an amplifier having suitable characteristics, particularly in laboratories associated with the atomic energy program. One circuit of which applicant is aware, designed by W. H. Jordan and P. R. Bell, and described in Review of Scientific Instruments 18, 703–705 (1947) and Review of Scientific Instruments 23, 30–33 (1952) consists of two cascaded sections and a cathode follower output tube. Each section has two stages having gain and a cathode follower, and negative feedback is used between the cathode of the cathode follower and the cathode of the first tube of the section to stabilize the gain and improve linearity. Amplifiers in accordance with this design have acceptable overload characteristics for most purposes, but the cathode follower output limits its usefulness where the output pulses are of negative polarity. In order to provide negative output pulses, say of 200 volts amplitude, the current through the tube and cathode resistor between pulses would have to be sufficient to maintain the cathode at at least +200 volts relative to ground, which obviously results in heavy current drain.

Another linear amplifier having characteristics suitable for use with proportional counter and scintillation counter X-ray and gamma-ray spectrometers is the so-called "long-tailed pair" amplifier, and a modification thereof described by Chase and Higinbotham in "Review of Scientific Instruments, 23, 34–36 (1952). In the latter modification, each amplifier stage consists of two "long-tailed pairs" connected in a negative feed-back loop, including a connection for introducing some positive feedback. Each stage requires four tubes (two duotriodes), and a correspondingly large number of associated circuit components, and must be carefully wired to insure proper operation.

With an appreciation of the foregoing features and limitations of the prior art, applicant has as a primary object of his invention to provide an improved linear amplifier circuit.

Another object of the invention is to provide an amplifier having linear characteristics over a wide dynamic range.

Still another object of the invention is to provide a linear amplifier of simple construction having a minimum of circuit components.

Still another object of the invention is to provide a linear amplifier employing negative feedback wherein the feedback loop is arranged so as not to load the amplifier circuit.

In the attainment of the foregoing objects, the invention is featured by the combination with an amplifier tube, preferably a pentode, of a feedback loop having gain connected between the anode and cathode of the amplifier. A portion of the signal appearing at the anode of the amplifier is applied to the grid of an amplifier connected in the feedback loop, the latter amplifier effecting a phase-reversal whereby the signal may be fed back to the cathode of the amplifier.

Other features and advantages of the circuit will be apparent from the following detailed description taken in connection with the accompanying drawing in which the single figure is a schematic diagram of a preferred embodiment of the invention. The circuit in accordance with the invention is illustrated in detail, except for filament heater connections which have been omitted for clarity, and is shown as it might be used in a pulse analysis system connected between a pre-amplifier circuit 8 of suitable design and a pulse height analyzer circuit 9. Circuits 8 and 9 form no part of the present invention, and are included only to establish an environment for the present circuit.

The circuit of the invention includes two electron tubes, preferably a pentode 10 and a triode 11, which have been illustrated as separate components, but which may be enclosed in a single envelope, as for example, a 6U8, the plate of tube 10 being connected through plate load resistor 12 to B+, and the cathode connected to ground through resistor 13. The suppressor grid of the pentode is connected to the cathode, and the screen grid is connected to B+ through resistor 14 and is by-passed to ground by condenser 15. Input pulses from the pre-amplifier are applied to the control grid of the tube, and output pulses are taken from the anode and applied, for example, to the pulse height analyzer 9. Pentode 10 is preferably operated near cut-off with the result that the plate of the tube is at approximately B+ potential in the quiescent condition. Consequently, a larger voltage swing is possible in the negative direction, and it is therefore preferred that the pulses applied to the grid of tube 10 are of positive polarity although linear amplification of negative pulses is also possible. In typical applications of the amplifier, the amplitude of the pulses at the anode of tube 10 may vary between ¼ volt and 200 volts, and inasmuch as the $g_m$ of tube 10 varies considerably over this range of output voltage, it is necessary to provide negative feedback to the amplifier to insure linearity over the range.

The feedback loop includes an attenuator network consisting of resistors 16 and 17 connected between the anode of tube 10 and ground, the ratio of their resistance preferably being of the order of 10 to 1, and capacitors 18 and 19 respectively connected in parallel with these resistors. With this ratio of resistances 16 and 17, which is intended to be illustrative only, approximately one-tenth of the signal appearing at the anode of tube 10 is coupled to the grid of tube 11. The anode of tube 11 is connected via load resistor 20 to B+ voltage and the cathode is returned to ground through resistor 21, resistors 20 and 21 being so selected that the gain of the amplifier is of the order of unity. The attenuated output of amplifier 10 appearing at the grid of tube 11 is therefore reversed in phase at the anode, and is coupled via capacitor 22 to the cathode of tube 10. The pulses fed back are then of the same polarity as those applied to the grid of tube 10, and being applied to the cathode, constitute negative feedback. Assuming that amplifier 10 has a gain of 60, which is easily obtainable, a 10:1 attenuation of the output therefrom, and unity gain for amplifier 11, and applying the feedback formula $G=A/1-A\beta$ to the system, the overall gain is 8.6, since $\beta$ equals $-0.1\times 1$ or $-0.1$. The feedback loop automatically compensates for changes in $g_m$ with changes in magnitude of the output signal with the result that the operation is linear over a wide dynamic range.

Because the gain of amplifier 10 is not constant with frequency, the pulse shape applied to the grid of tube 10 will not be reproduced at the anode unless frequency compensation is provided. Condensers 18 and 19 in the attenuator network function to provide the necessary frequency compensation. As is well known to ones skilled in the art, if, in a network of the type here included, $$R_{16}C_{18}=R_{17}C_{19}$$

the network will be insensitive to frequency. However, since the gain of amplifier 10 is frequency sensitive, it is necessary to introduce some frequency sensitivity in the feedback path. To this end, capacitor 19 is selected to have a capacitance about ten times as large as that of capacitor 18 (in the present illustrative circuit), 100 $\mu\mu$f. and 10 $\mu\mu$f., respectively, being suitable. Capacitor 18 is adjustable in value to permit tuning of the attenuator circuit to make the overall system frequency insensitive, whereby the pulse shape of the output corresponds to the input pulses.

In a typical amplifier constructed according to the drawing and operated satisfactorily over a dynamic range of about 200 volts, the various components were of the following values and types:

| | |
|---|---|
| Tubes **10** and **11** | Pentode-triode 6U8. |
| B+ | 350 v. |
| R17 | 100K. |
| R20 | 5.6K. |
| R12 | 15K. |
| R13 | 1K. |
| R14 | 270K |
| R16 | 1 meg. |
| R21 | 3.3K. |
| C18 | 10 $\mu\mu$f. |
| C19 | 100 $\mu\mu$f. |
| C22 | 1 $\mu$f. |

While there have been shown and described and pointed out the novel features of the invention as applied to a preferred embodiment, it will be understood that various omissions and substitutions and changes in circuit values may be made by those skilled in the art without departing from the spirit of the invention. For example, while a single stage of amplification has been shown in the feedback loop, namely, amplifier 11, it will of course be recognized that additional stages, so long as the necessary phase relationships are maintained, may be used without altering the operation of the amplifier. Also, while the illustrated specific embodiment discloses the connection of the anode of tube 11 to the cathode of tube 10, it will be understood that the feedback loop may be connected to an amplifier stage prior to amplifier 10, providing such earlier stage is selected to afford negative feedback. It is applicant's intention, therefore, to be limited only as indicated by the scope of the following claim.

What is claimed is:

A linear pulse amplifier having wide dynamic range comprising, in combination, a first amplifier including a pentode electron tube having anode, cathode, and control grid electrodes, a source of energizing potential, a resistor connected between the anode of said pentode and said source of energizing potential, a resistor connected between the cathode of said pentode and a point of ground potential, an input circuit connected to the grid of said pentode for applying pulses of widely varying amplitudes thereto whereby the transconductance of said pentode varies with the magnitude of the signal appearing at the anode of said pentode; means for deriving the output of said linear pulse amplifier from said plate of said pentode, and a feedback circuit for said first amplifier for automatically compensating for said changes in transconductance of said pentode and the frequency sensitivity of said first amplifier comprising an attenuating network formed of first and second resistors serially connected between the anode of said pentode and ground potential, first and second capacitors respectively connected in parallel with said first and second resistors, a second amplifier of approximately unity gain including a second electron tube having at least anode, cathode, and control grid electrodes, a connection between the junction of said first and second resistors of said attenuating network and the control grid of said second tube, a resistor connected between the anode of said second tube and said source of energizing potential, a resistor connected between the cathode of said second tube and a point of ground potential, and a connection including a third capacitor between the anode of said second tube and the cathode of said pentode, said first and second resistors and said first and second capacitors having such relative values that said feedback circuit is frequency sensitive in a direction to compensate for the frequency sensitivity of said first amplifier whereby said first amplifier with feedback is frequency insensitive.

References Cited in the file of this patent

UNITED STATES PATENTS

| | | |
|---|---|---|
| 2,253,976 | Guanella | Aug. 26, 1941 |
| 2,367,711 | Bode | Jan. 23, 1945 |
| 2,481,533 | Pratt | Sept. 13, 1949 |
| 2,541,326 | Bielek | Feb. 13, 1951 |